United States Patent
Lee et al.

(10) Patent No.: US 6,737,305 B2
(45) Date of Patent: May 18, 2004

(54) THIN FILM TRANSISTOR MANUFACTURE METHOD

(75) Inventors: Yu-Chou Lee, Taipei (TW); Yi-Tsai Hsu, Taoyuan (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 10/248,521

(22) Filed: Jan. 27, 2003

(65) Prior Publication Data

US 2003/0224562 A1 Dec. 4, 2003

(30) Foreign Application Priority Data

May 31, 2002 (TW) ........................................ 91111642 A

(51) Int. Cl.⁷ .................. H01L 21/00; H01L 21/331; H01L 21/20; H01L 21/04; H01L 21/28
(52) U.S. Cl. .................. 438/151; 438/149; 438/161; 438/166; 438/311; 438/479; 438/482; 438/483; 438/485; 438/488; 438/510; 438/572; 438/578; 438/585; 438/586; 438/597; 438/669; 438/673; 438/761
(58) Field of Search .................. 438/149, 151, 438/161, 166, 158, 438, 488, 510, 572, 578, 585, 586, 597, 669, 311, 479, 482, 483, 485, 673, 761

(56) References Cited

U.S. PATENT DOCUMENTS

| | | | | |
|---|---|---|---|---|
| 6,110,766 A | * | 8/2000 | Hong | 438/151 |
| 6,159,779 A | * | 12/2000 | Huang et al. | 438/158 |
| 6,274,412 B1 | * | 8/2001 | Kydd et al. | 438/149 |
| 6,287,899 B1 | * | 9/2001 | Park et al. | 438/149 |
| 6,335,213 B1 | * | 1/2002 | Zhang et al. | 438/30 |
| 6,387,737 B1 | * | 5/2002 | Yamazaki et al. | 438/149 |
| 6,406,928 B1 | * | 6/2002 | Jen et al. | 438/30 |
| 6,429,057 B1 | * | 8/2002 | Hong et al. | 438/158 |
| 6,451,635 B2 | * | 9/2002 | Park et al. | 438/158 |
| 6,465,286 B2 | * | 10/2002 | Possin et al. | 438/155 |
| 6,524,876 B1 | * | 2/2003 | Baek et al. | 438/48 |
| 6,531,392 B2 | * | 3/2003 | Song et al. | 438/648 |
| 6,562,668 B2 | * | 5/2003 | Jang et al. | 438/158 |
| 6,607,947 B1 | * | 8/2003 | Zhang et al. | 438/151 |
| 2001/0019125 A1 | * | 9/2001 | Hong et al. | 257/59 |
| 2002/0013020 A1 | * | 1/2002 | Kim et al. | 438/149 |
| 2002/0160555 A1 | * | 10/2002 | Hong et al. | 438/158 |
| 2003/0038306 A1 | * | 2/2003 | Izumi et al. | 257/222 |

* cited by examiner

*Primary Examiner*—John F. Niebling
*Assistant Examiner*—Stanetta Isaac
(74) *Attorney, Agent, or Firm*—Jiang Chyun IP Office

(57) ABSTRACT

A Thin Film Transistor (TFT) manufacture method, comprising manufacture of a gate, a gate isolation layer, a channel layer, and a source/drain. Wherein, the manufacture of the channel layer comprises: forming a first a-Si layer by using a low deposition rate (LDR) (Chemical Vapor Deposition, CVD); forming a second a-Si layer by using a high deposition rate (HDR); and forming an N+Mixed a-Si layer. When the first a-Si layer is formed in the present invention, the flux ratio of $H_2/SiH_4$ is adjusted to a range from 0.40 to 1.00 to increase the number of defects in the first a-Si layer. When the TFT is irradiated by the light, the photo leakage current generated in the channel layer is trapped in the defects in the first a-Si layer. Therefore, the TFT photo leakage current can be significantly reduced.

9 Claims, 24 Drawing Sheets

|  | Film formed with LDR (the first a-Si layer) | Film formed with HDR (the second a-Si layer) |
|---|---|---|
| $SiH_4$ (sccm) | 4400 | 5700 |
| $H_2$ (sccm) | 22000 | 5400 |
| $H_2/SiH_4$ | 5.0 | 0.95 |
| Pressure (mbar) | 1.1 | 1.4 |
| RF Power (W) | 140 | 250 |

FIG. 2 (PRIOR ART)

| ID | On current $I_{on}(\mu A)$ | Off current $I_{off}(pA)$ | Threshold voltage $V_{th}(V)$ | Migration rate $\mu_{fe}$ (cm$^2$/v·s) |
|---|---|---|---|---|
| 11 | 6.686 | 5.384 | 3.327 | 0.567 |
| 12 | 6.38 | 4.564 | 3.351 | 0.543 |
| 18 | 6.472 | 4.438 | 3.302 | 0.548 |
| 19 | 6.81 | 4.459 | 3.409 | 0.583 |
| 20 | 6.512 | 4.794 | 3.359 | 0.553 |
| Average | 6.572 | 4.7278 | 3.3496 | 0.5588 |

FIG. 3 (PRIOR ART)

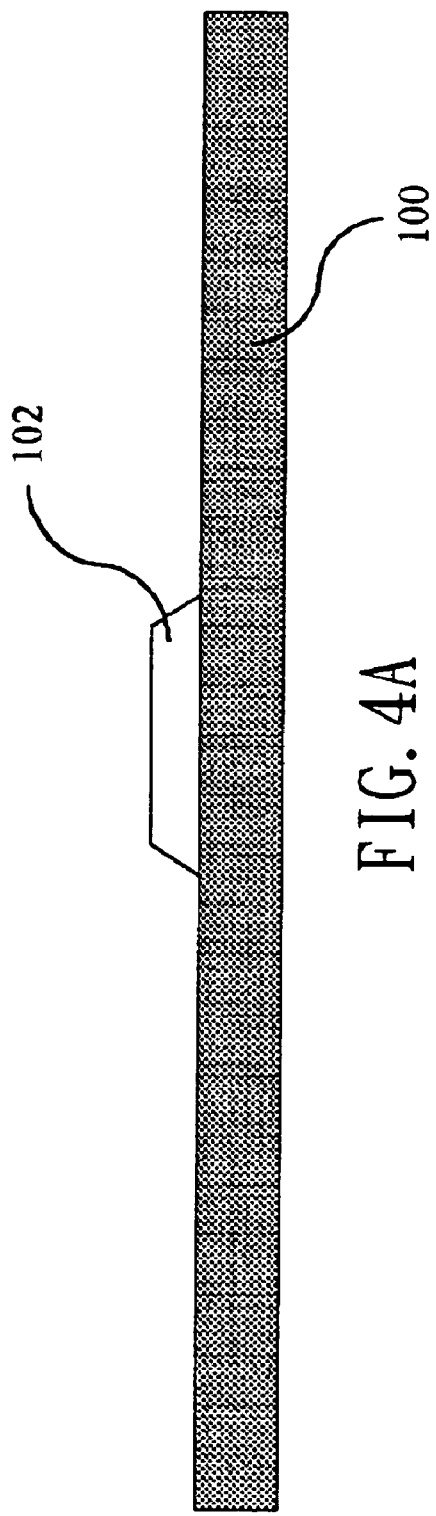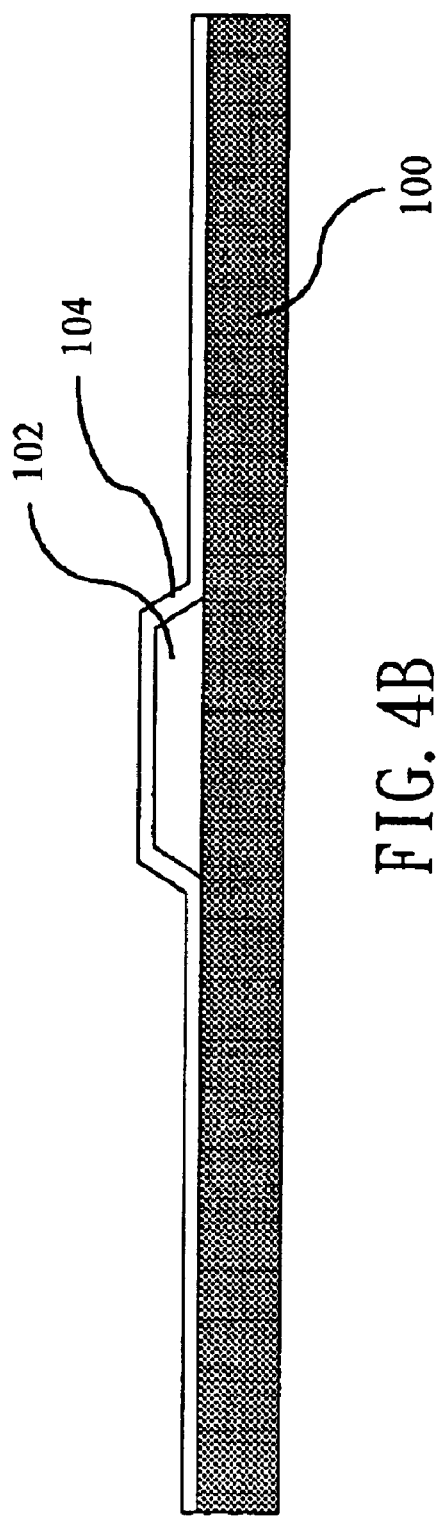

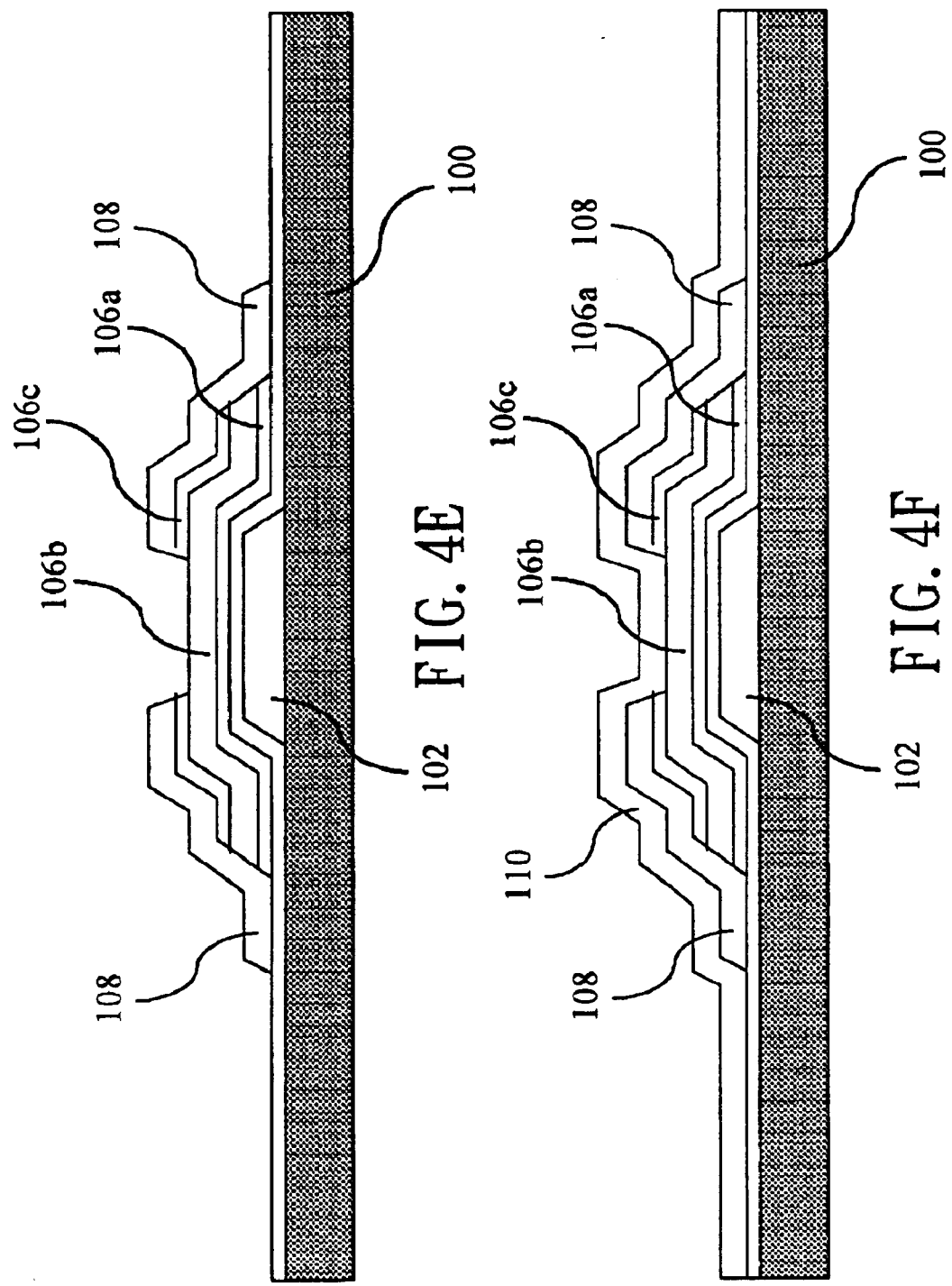

|  | Prior art | Present embodiment |
|---|---|---|
| SiH$_4$ (sccm) | 4400 | 1000~4600 |
| H$_2$ (sccm) | 22000 | 400~4600 |
| H$_2$/SiH$_4$ | 5.0 | 0.40~1.00 |
| Pressure (mbar) | 1.1 | 0.75~1.00 |
| RF Power (W) | 140 | 70~100 |

FIG. 5

|  | Prior art | Present embodiment |
|---|---|---|
| SiH$_4$ (sccm) | 5700 | 1000~5700 |
| H$_2$ (sccm) | 5400 | 950~5700 |
| H$_2$/SiH$_4$ | 0.95 | 0.95~1.0 |
| Pressure (mbar) | 1.4 | 1.3~1.6 |
| RF Power (W) | 250 | 200~320 |

| ID | On current $I_{on}(\mu A)$ | Off current $I_{off}(pA)$ | Threshold voltage $V_{th}(V)$ | Migration rate $\mu_{fe}$ (cm$^2$/v.s) |
|---|---|---|---|---|
| 1 | 7.968 | 3.107 | 2.362 | 0.611 |
| 2 | 7.622 | 4.066 | 2.466 | 0.591 |
| 3 | 7.706 | 2.759 | 2.435 | 0.596 |
| 9 | 8.476 | 3.86 | 2.37 | 0.651 |
| 10 | 7.784 | 3.899 | 2.415 | 0.601 |
| Average | 7.9112 | 3.5382 | 2.4096 | 0.61 |

| ID | On current $I_{on}(\mu A)$ | Off current $I_{off}(pA)$ | Threshold voltage $V_{th}(V)$ | Migration rate $\mu_{fe}$ (cm$^2$/v.s) |
|---|---|---|---|---|
| 1 | 8 | 2.778 | 2.689 | 0.636 |
| 2 | 7.172 | 2.893 | 2.819 | 0.578 |
| 3 | 7.596 | 2.654 | 2.803 | 0.611 |
| 9 | 8.102 | 2.846 | 2.626 | 0.64 |
| 10 | 7.95 | 2.54 | 2.696 | 0.632 |
| 11 | 7.99 | 2.984 | 2.657 | 0.633 |
| 12 | 8.65 | 2.904 | 2.688 | 0.687 |
| 18 | 7.966 | 2.368 | 2.73 | 0.635 |
| 19 | 7.546 | 2.545 | 2.642 | 0.598 |
| 20 | 7.516 | 2.186 | 2.569 | 0.589 |
| Average | 7.8488 | 2.6698 | 2.6919 | 0.6239 |

| ID | On current $I_{on}(\mu A)$ | Off current $I_{off}(pA)$ | Threshold voltage $V_{th}(V)$ | Migration rate $\mu_{fe}$ (cm$^2$/v·s) |
|---|---|---|---|---|
| 1 | 8.26 | 1.919 | 2.622 | 0.652 |
| 2 | 7.888 | 2.225 | 2.722 | 0.628 |
| 3 | 7.716 | 2.006 | 2.772 | 0.619 |
| 9 | 8.594 | 2.278 | 2.261 | 0.678 |
| 10 | 8.42 | 2.22 | 2.66 | 0.668 |
| 11 | 8.34 | 2.181 | 2.587 | 0.656 |
| 12 | 8.496 | 2.145 | 2.675 | 0.674 |
| 18 | 8.842 | 2.454 | 2.64 | 0.698 |
| 19 | 8.504 | 2.195 | 2.494 | 0.661 |
| 20 | 8.126 | 1.995 | 2.571 | 0.637 |
| Average | 8.3186 | 2.1618 | 2.6004 | 0.6571 |

| ID | On current $I_{on}(\mu A)$ | Off current $I_{off}(pA)$ | Threshold voltage $V_{th}(V)$ | Migration rate $\mu_{fe}(cm^2/v \cdot s)$ |
|---|---|---|---|---|
| 1 | 8.338 | 2.994 | 1.928 | 0.612 |
| 3 | 8.176 | 2.829 | 1.984 | 0.604 |
| 10 | 8.244 | 3.192 | 1.912 | 0.603 |
| 11 | 8.38 | 2.99 | 1.95 | 0.615 |
| 12 | 8.62 | 3.108 | 1.936 | 0.633 |
| 18 | 8.19 | 2.391 | 1.972 | 0.603 |
| 19 | 8.068 | 2.713 | 1.903 | 0.59 |
| 20 | 7.902 | 2.868 | 1.969 | 0.583 |
| Average | 8.23975 | 2.885625 | 1.94425 | 0.605375 |

| ID | On current $I_{on}(\mu A)$ | Off current $I_{off}(pA)$ | Threshold voltage $V_{th}(V)$ | Migration rate $\mu_{fe}$ (cm$^2$/v.s) |
|---|---|---|---|---|
| 1 | 7.882 | 2.925 | 2.275 | 0.599 |
| 2 | 7.6 | 2.858 | 2.343 | 0.582 |
| 3 | 7.532 | 2.622 | 2.392 | 0.579 |
| 9 | 8.144 | 2.534 | 2.24 | 0.617 |
| 10 | 7.862 | 3.321 | 2.288 | 0.598 |
| 11 | 7.988 | 2.789 | 2.261 | 0.607 |
| 12 | 8.166 | 2.608 | 2.273 | 0.62 |
| 18 | 8.256 | 2.754 | 2.338 | 0.632 |
| 19 | 7.782 | 2.396 | 2.238 | 0.589 |
| 20 | 7.77 | 2.245 | 2.187 | 0.586 |
| Average | 7.8982 | 2.7052 | 2.2835 | 0.6009 |

FIG. 11

| | On current $I_{on}(\mu A)$ | Off current $I_{off}(pA)$ | Threshold voltage $V_{th}(V)$ | Migration rate $\mu_{fe}$ (cm²/v.s) |
|---|---|---|---|---|
| DT293A | 7.89982 | 2.7052 | 2.2835 | 0.6009 |
| DB340A | 8.23975 | 2.885625 | 1.94425 | 0.605 |
| DT395A | 8.3186 | 2.1618 | 2.6004 | 0.6571 |
| DT394A | 7.84881 | 2.6698 | 2.6919 | 0.6239 |
| DB025A | 7.91121 | 3.5382 | 2.4096 | 0.61 |
| Average | 8.043314 | 2.792125 | 2.38593 | 0.61938 |

FIG. 12

|  | Prior art | Present embodiment |
|---|---|---|
| $I_{photo}$ | 1E-10 | 5E-11 |
| $I_{on}$ ($\mu A$) | 6.57 | 8.04 |
| $I_{off}$ ($\mu A$) | 4.72 | 2.79 |
| $V_{th}$ (V) | 3.34 | 2.38 |
| $\mu_e$ (cm$^2$/s.v) | 0.55 | 0.62 |
| $H_2/SiH_4$ | 5.0 | 0.40~1.00 |

FIG. 17

| Thickness of the second a-Si layer | On current $I_{on}(\mu A)$ | Off current $I_{off}(pA)$ | Threshold voltage $V_{th}(V)$ | Migration rate $\mu_{fe}$ (cm$^2$/v·s) |
|---|---|---|---|---|
| 1000 Å | 3.5415 | 4.19775 | 5.27225 | 0.36875 |
| 1250 Å | 5.0105 | 4.264 | 4 | 0.45775 |
| 1500 Å | 5.53355 | 4.4285 | 3.54125 | 0.482 |
| 1750 Å | 5.909 | 4.27125 | 3.3065 | 0.504 |
| 2000 Å | 6.1005 | 3.61125 | 3.15425 | 0.5145 |

FIG. 18

THIN FILM TRANSISTOR MANUFACTURE METHOD

CROSS REFERENCE TO RELATED APPLICATIONS

This application claims the priority benefit of Taiwanese application serial no. 91111642, filed on May 31, 2002.

BACKGROUND OF INVENTION

1. Field of Invention

The present invention generally relates to a Thin Film Transistor (TFT) manufacture method, and more particularly, to a manufacture method of making an a-Si layer in the TFT. The method optimizes the electric characteristics of the TFT, and restrains the photo-leakage current generated when the a-Si layer in the TFT is irradiated by the light.

2. Description of Related Art

The fast growth of multimedia has mainly benefited from the great improvement in semiconductors and display apparatus. For the display, the Cathode Ray Tube (CRT) has continuously monopolized the display market in recent years due to its excellent display quality and advantage of being cost-effective. However, for the environment of the user using multiple terminals/display apparatus on a desktop, or from the environmental protection viewpoint and the trend of saving energy, CRTs have many problems due to deficiencies of space utilization and power consumption. As a result, CRTs cannot fulfill the requirements of the lighter, thinner, shorter, and smaller as well as low power consumption. Therefore, the Thin Film Transistor Liquid Crystal Display (TFT-LCD) having the advantages of the high display quality, good space utilization, low power consumption, and no radiation gradually has become the mainstream.

The general TFT-LCD mainly constitutes an LCD panel and a driving circuit. Wherein, the LCD panel comprises a TFT array substrate, a color filter substrate (C/F substrate), and a liquid crystal layer located in between these two substrates. The photo film plates such as the polarizer, the photo-intensity plate, and the diffusion plate are attached to the outside of two substrates. The driving circuit is generally bonded to the panel with the chip-bond manner. The Chip On Board (COB), the Chip On Glass (COG), and the Tape Automated Bonding (TAB) manners are generally used. Moreover, since the liquid crystal molecule cannot emit light itself, the light source with enough intensity must be provided for LCD to perform the display operation. For the reflection type panel, the light source generally comes from a front light module or an external light source. For the penetration type panel, the light source generally comes from a back light module.

The well known TFT can be generally divided into two different types: the a-Si layer TFT and the polycrystalline silicon TFT. Since the manufacture process of the a-Si TFT is simpler compared to the manufacture process of the polycrystalline silicon TFT, the technique of liquid crystal driven by the a-Si TFT array is still mainstream. However, there are some problems that exist in the a-Si TFT element itself, for example, the a-Si layer in the TFT will generate the photo leakage current $I_{photo}$ after it is irradiated by the front light source, the back light source or the external light source. The photo leakage current $I_{photo}$ not only impacts the performance of the TFT element itself, but also generates problems such as frame flicker or cross talk when the frame is displayed.

FIG. 1 schematically shows a flow chart for making the a-Si layer (channel layer) in a conventional TFT. Referring to FIG. 1, the a-Si layer (channel layer) in the conventional TFT is generally formed above the gate by using the Chemical Vapor Deposition (CVD) method. The manufacture of the a-Si layer is generally performed in three phases: (1) forming a first a-Si layer with a low deposition rate (LDR); (2) forming a second a-Si layer with a high deposition rate (HDR); and (3) performing the N+Mixed to the second a-Si layer to form a N+Mixed a-Si layer.

FIG. 2 lists the manufacture process parameters used in the first a-Si layer formed by using the LDR and the second a-Si layer formed by using the HDR in the prior art. Referring to FIG. 2, when the first a-Si layer is formed by using the LDR, the flux of $SiH_4$ is 4400 sccm, the flux of $H_2$ is 22000 sccm, and the flux ratio of $H_2/SiH_4$ is 5.0. Moreover, the operating pressure used to form the film of the first a-Si layer film is 1.1 mbar, and the power of the radio frequency (RF) is 140 W. Such a high flux of $H_2$ can achieve the objective of repairing the defects. It means a large amount of the $H_2$ links with the dangling bonds in the first a-Si layer, so that the number of the defects in the first a-Si layer can be reduced. In other words, the first a-Si layer with high quality film can be formed by controlling the $H_2/SiH_4$ flux ratio to stay at about 5.0 to perform the film forming with LDR.

Similarly, referring to FIG. 2, after the first a-Si layer is formed, the second a-Si layer is formed above the first a-Si layer by using the HDR. The flux of the $SiH_4$ is 5700 sccm, the flux of $H_2$ is 5400 sccm, and the flux ratio of $H_2/SiH_4$ is 0.95. Moreover, the operating pressure used to form the film of the second a-Si layer film is 1.4 mbar, and the RF power is 250 W.

FIG. 3 lists the electric characteristics and averages of the conventional TFT. Referring to FIG. 3, the channel layer in the conventional TFT is made by using the manufacture process conditions listed in FIG. 2. The average of the on current $I_{on}$ of the conventional TFT is about 6.572 µA, the average of the off current $I_{off}$ is about 4.7278 pA, the average of the threshold voltage $V_{th}$ is about 3.3496V, and the average of the electronic migration rate $\mu_{fe}$ is about 0.5588 $cm^2/v.s$.

The flux ratio of $H_2/SiH_4$ is controlled to stay at about 5.0 when the first a-Si layer is made by using the LDR in the prior art. The high flux of $H_2$ is applied to the first a-Si layer to repair the defects, and further to have the off current $I_{off}$ reduce to about 4.7278 pA (below 5 pA). However, when evaluating the performance of the a-Si TFT element itself, besides considering the parameters such as the on current $I_{on}$, the off current $I_{off}$, the threshold voltage $V_{th}$, and the electronic migration rate $\mu_{fe}$, the photo leakage current $I_{photo}$ of the element is also served as a factor of the evaluation. The on current $I_{on}$, the off current $I_{off}$, the threshold voltage $V_{th}$, and the electronic migration rate $\mu_{fe}$ of the conventional TFT are all in the adequate range. However, the TFT generates photo leakage current $I_{photo}$ after it is irradiated by the front light source, the back light source or the external light source. The photo leakage current $I_{photo}$ generated usually is about 1E-10 Amp, and it significantly deteriorates the display quality.

SUMMARY OF INVENTION

Therefore, the objective of the present invention is to provide a TFT manufacture method. The method efficiently improves the photo leakage current problem without impacting the electric characteristics such as the on current $I_{on}$, the off current $I_{off}$, the threshold voltage $V_{th}$, and the electronic migration rate $\mu_{fe}$.

In order to achieve the objective mentioned above, a TFT manufacture method is provided, comprising the steps of follows. At first, a substrate is provided, and a gate and a gate isolation layer that covers the gate are provided on the substrate. Then, the first a-Si layer is formed by using an LDR, wherein the first a-Si layer is formed under the condition of the flux ratio of $H_2/SiH_4$ being in the range from 0.40 to 1.00. The second a-Si layer is subsequently formed by using the HDR, wherein the second a-Si layer is formed under the condition of the flux ratio of $H_2/SiH_4$ being within a range from 0.95 to 1.00. Afterwards, the N+Mixed a-Si layer is formed on the surface of the second a-Si layer. The N+Mixed a-Si layer is formed, for example, by performing an N-type ion implantation on the surface of the second a-Si layer. After the manufacture of the film layer mentioned above is completed, the first a-Si layer, the second a-Si layer, and the N+Mixed a-Si layer are defined to form a channel layer. Finally, a source/drain is formed on both sides of the channel layer to constitute a three electrodes TFT having a gate, a source and a drain.

In the TFT manufacture method of the present invention, a passivation layer is further formed on the substrate after the source/drain is formed to cover the whole TFT, so as to further assure the reliability of the TFT element.

In the TFT manufacture method of the present invention, the conditions of the manufacture process to form the first a-Si layer are as follows: the flux of the $SiH_4$ is about 1000 to 4600 sccm, the flux of $H_2$ is about 400 to 4600 sccm, the operating pressure is about 0.75 to 1.00 mbar, and the RF power is about 70 to 100 W.

In the TFT manufacture method of the present invention, the conditions of the manufacture process to form the second a-Si layer are as follows: the flux of the $SiH_4$ is from about 1000 to 5700 sccm, the flux of $H_2$ is from about 950 to 5700 sccm, the operating pressure is from about 1.3 to 1.6 mbar, and the RF power is from about 200 to 320 W.

In the TFT manufacture method of the present invention, the thickness of the first a-Si layer is between about 100 to 500 angstroms, the thickness of the second a-Si layer is between about 1000 to 2000 angstrom, and the thickness of the N+Mixed a-Si layer is between about 200 to 400 angstrom.

In order to achieve the objective mentioned above, an a-Si layer manufacture method is provided, comprising the steps of as follows. At first, a substrate is provided. Then, a first a-Si layer is formed on the substrate by using the Chemical Vapor Deposition (CVD) method, wherein the first a-Si layer is formed under the condition of the flux ratio of $H_2/SiH_4$ being within a range from 0.40 to 1.00. Afterwards, a second a-Si layer is formed above the first a-Si layer by using the CVD method, wherein the second a-Si layer is formed under the condition of the flux ratio of $H_2/SiH_4$ being within a range from 0.95 to 1.00.

In the a-Si layer manufacture method of the present invention, the conditions of the manufacture process to form the first a-Si layer are as follows: the flux of the $SiH_4$ is about 1000 to 4600 sccm, the flux of $H_2$ is about 400 to 4600 sccm, the operating pressure is such as 0.75 to 1.00 mbar, and the RF power is about 70 to 100 W.

In the a-Si layer manufacture method of the present invention, the conditions of the manufacture process to form the second a-Si layer are as follows: the flux of the $SiH_4$ is from about 1000 to 5700 sccm, the flux of $H_2$ is from about 950 to 5700 sccm, the operating pressure is from about 1.3 to 1.6 mbar, and the RF power is from about 200 to 320 W.

In the a-Si layer manufacture method of the present invention, the thickness of the first a-Si layer is between about 100 to 500 angstrom, and the thickness of the second a-Si layer is between about 1000 to 2000 angstrom.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a flow chart for making the a-Si layer (channel layer) in a conventional TFT;

FIG. 2 lists the manufacture process parameters used in the first a-Si layer formed by using the LDR and the second a-Si layer formed by using the HDR in the prior art;

FIG. 3 lists the electric characteristics and averages of the conventional TFT;

FIGS. 4A–4F schematically shows cross-sections of the TFT manufacture process;

FIG. 5 lists the manufacture process parameters used in the first embodiment and the first a-Si layer formed by using the LDR in the prior art;

FIG. 6 lists the manufacture process parameters used in the first embodiment and the second a-Si layer formed by using the HDR in the prior art;

FIGS. 7–11 respectively lists the electric characteristics and averages of the TFT in the first embodiment (DB025A, DT394A, DT395A, DB340A, and DT293A);

FIG. 12 schematically shows a comparison table of the electric characteristics of the TFT in the first embodiment (DB025A, DT394A, DT395A, DB340A, and DT293A);

FIG. 17 schematically shows a comparison table of the electrical characteristics of the first embodiment (DB025A, DT394A, DT395A, DB340A, and DT293A) and the conventional TFT;

FIG. 18 is a table schematically showing the relationship of the thickness of the second a-Si layer in the TFT and its electrical characteristics.

DETAILED DESCRIPTION

The First Embodiment

Figure 1:
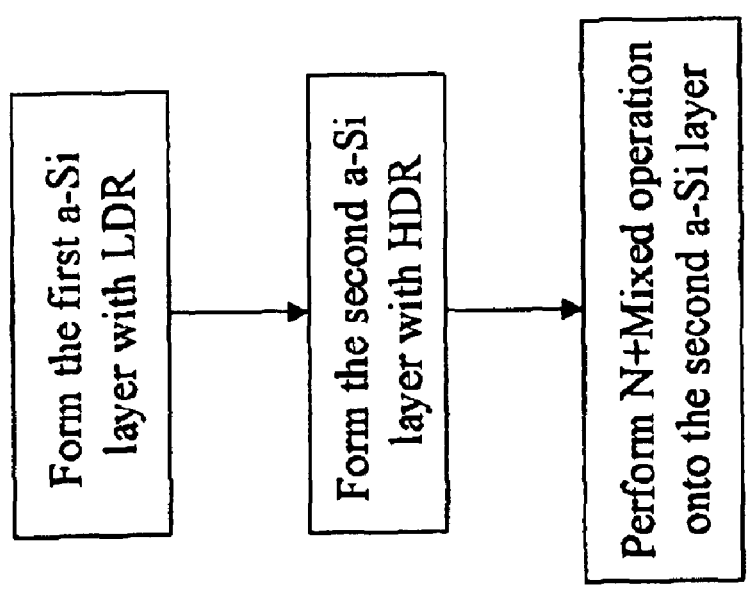
Figure 4C:
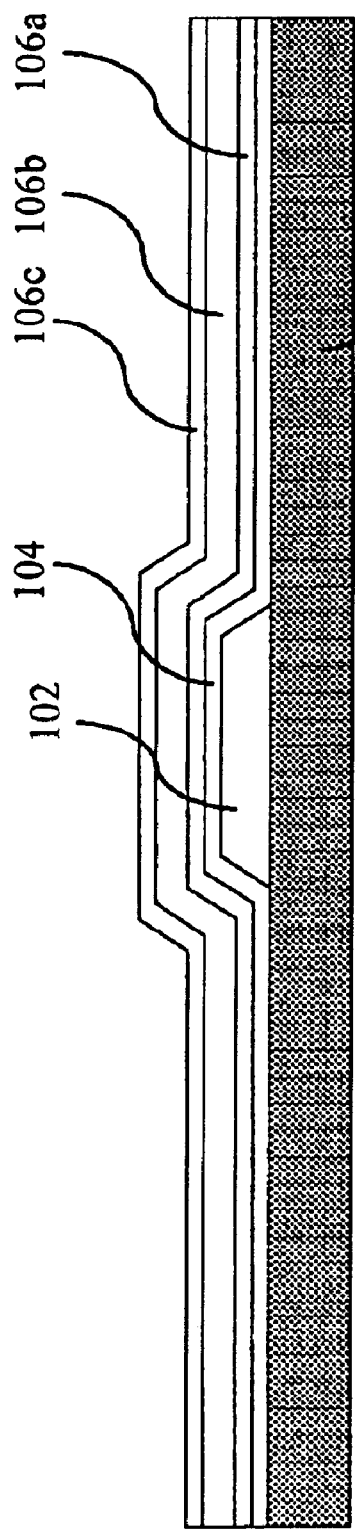

FIGS. 4A–4F schematically shows the sectional sketch maps of the TFT manufacture process. Referring to FIG. 4A first, a substrate 100 is provided, the substrate 100 is a substrate such as glass substrate or substrate made of other transparent materials. A gate 102 is subsequently formed on the substrate 100. The gate 102 is formed via the method of forming the Metal 1 overall on the substrate 100 first, then the Metal 1 mentioned above is defined by using the manufacture process of the microfilm and etch to form the gate 102, wherein the gate 102 is made of conductive materials such as Ta and Cr.

Then, referring to FIG. 4B, after the gate 102 is formed, a gate isolation layer 104 is formed on the substrate 100. The gate isolation layer 104 covers the gate 102, wherein the gate isolation layer 104 is made of material such as $SiN_x$, $SiO_x$, or other dielectric materials.

Then, referring to FIG. 4C, after the gate isolation layer 104 is formed, a first a-Si layer 106a and a second a-Si layer 106b are formed sequentially, and a N+Mixed a-Si layer 106c is subsequently formed on the surface of the second a-Si layer 106b. The first a-Si layer 106a is formed by using the CVD with LDR, and the thickness of the first a-Si layer 106a is from 100 to 500 angstroms. The second a-Si layer 106b is formed by using the CVD with HDR, and the thickness of the second a-Si layer 106b is from 1000 to 2000 angstroms. The N+Mixed a-Si layer 106c is formed by using the ion implantation method, and the thickness of the formed N+Mixed a-Si layer is from 200 to 400 angstroms. The manufacture conditions for forming the first a-Si layer 106a and the second a-Si layer 106b are descried in detail accompanying FIG. 5 and FIG. 6 hereinafter.

Figure 4D:
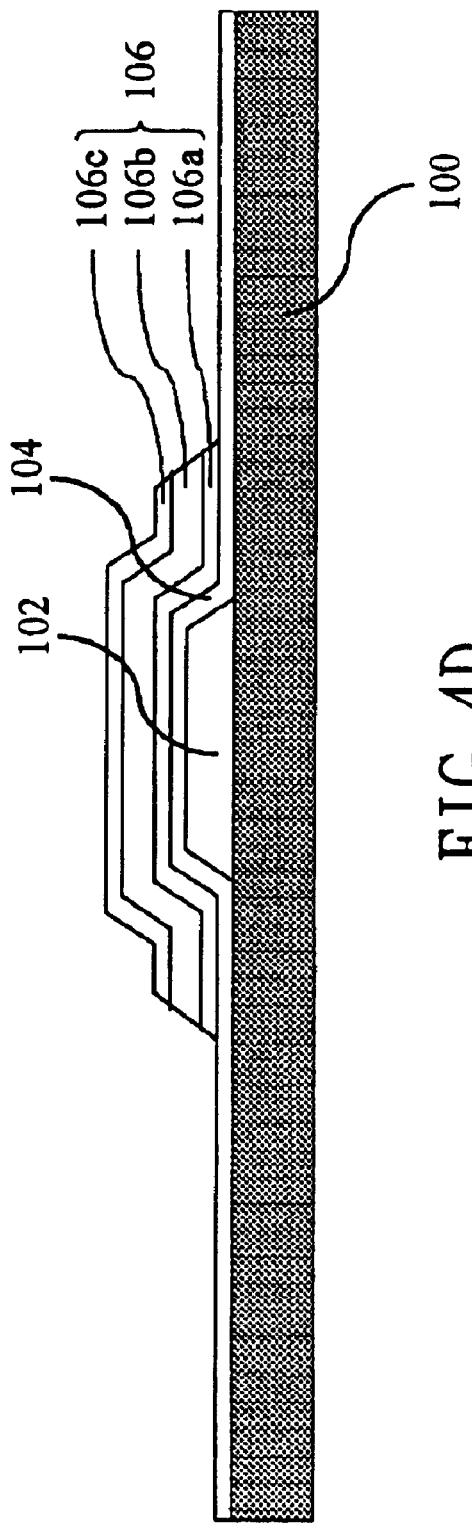
Figure 13:
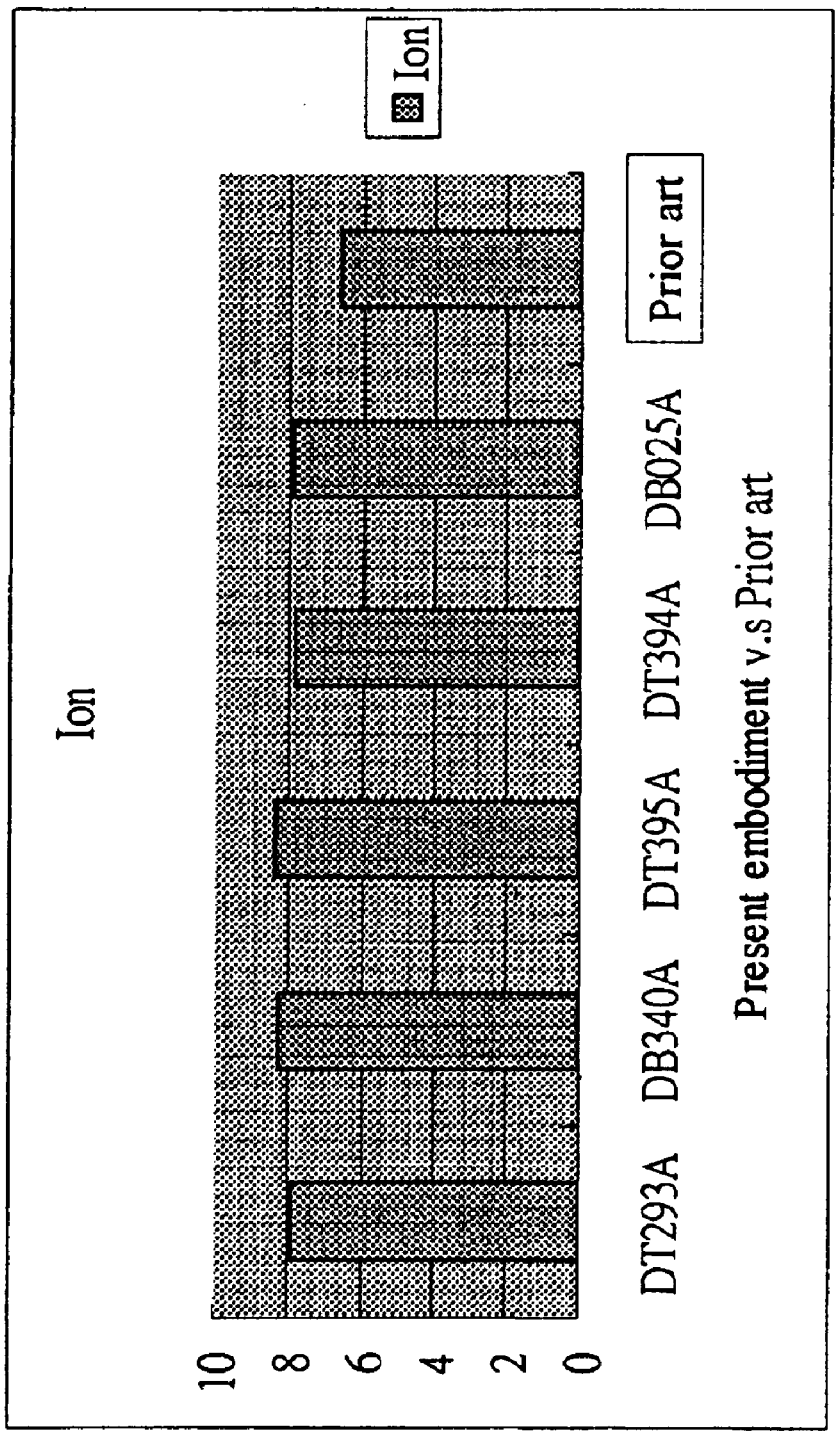
FIGS. 13–16 respectively shows a comparison table of the on current $I_{on}$, the off current $I_{off}$, the threshold voltage $V_{th}$, and the electronic migration rate $\mu_{fe}$ in the first embodiment (DB025A, DT394A, DT395A, DB340A, and DT293A) and in the conventional TFT.
Figure 14:
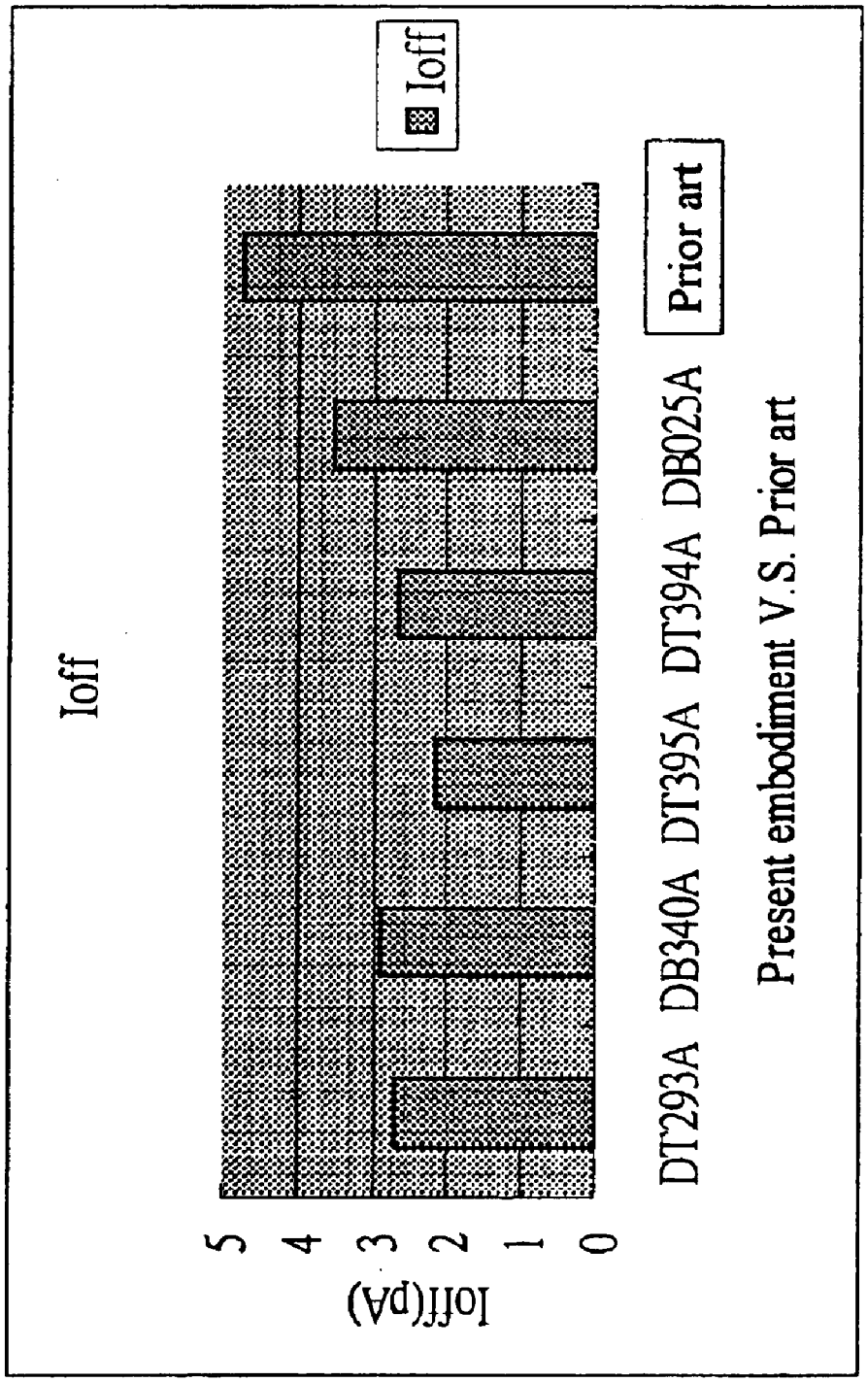
Figure 15:
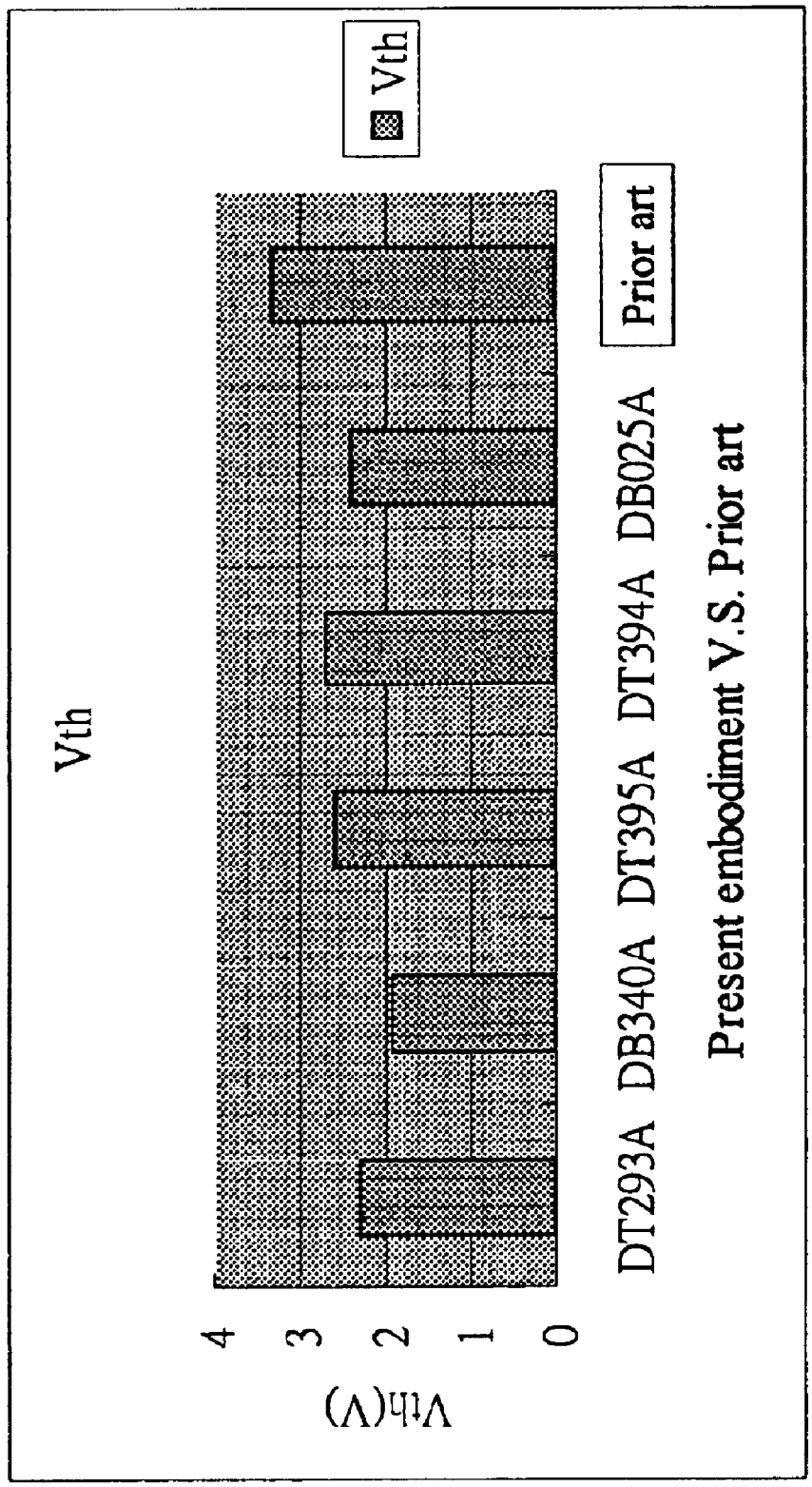
Figure 16:
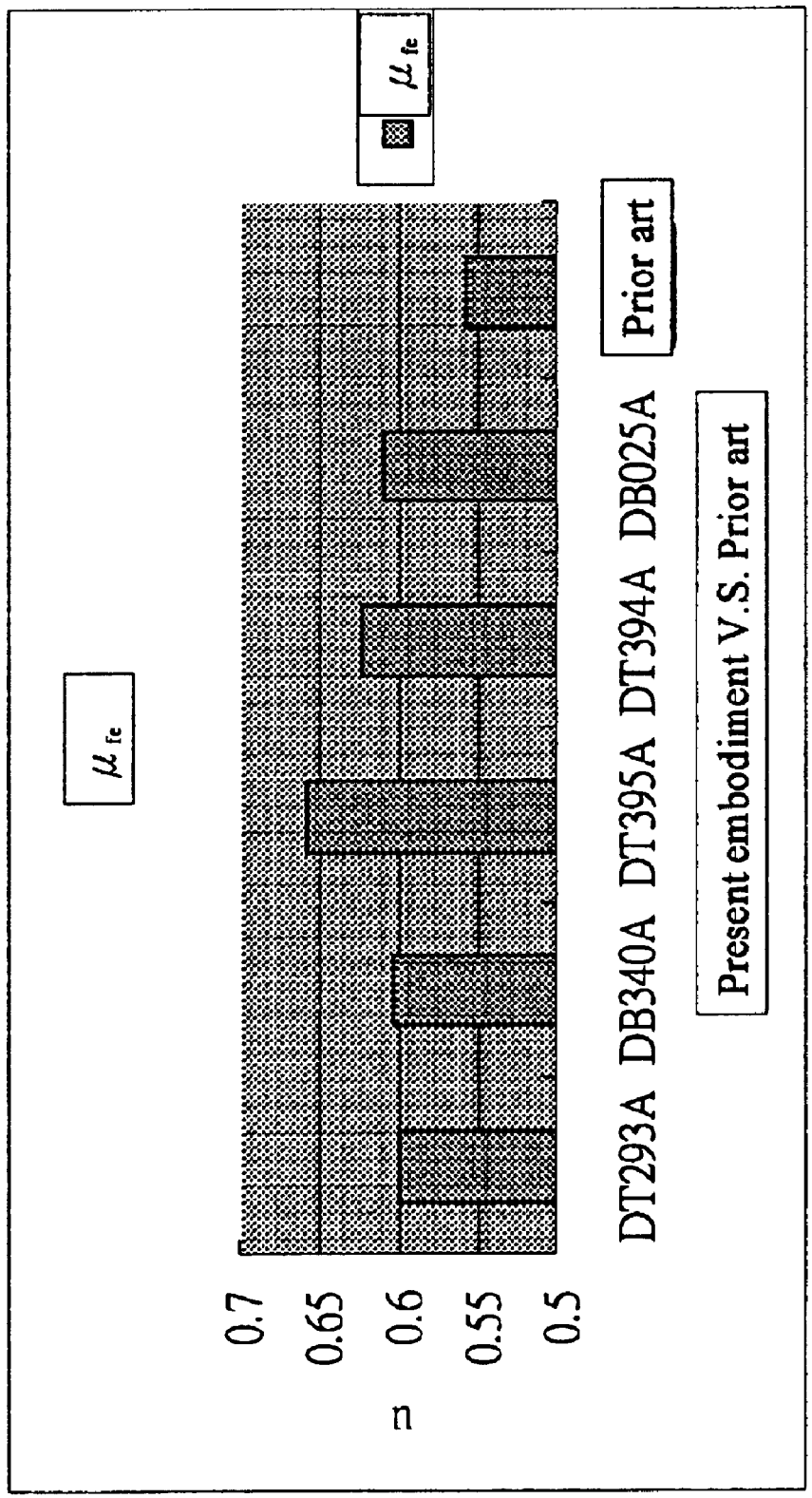
Figure 19:
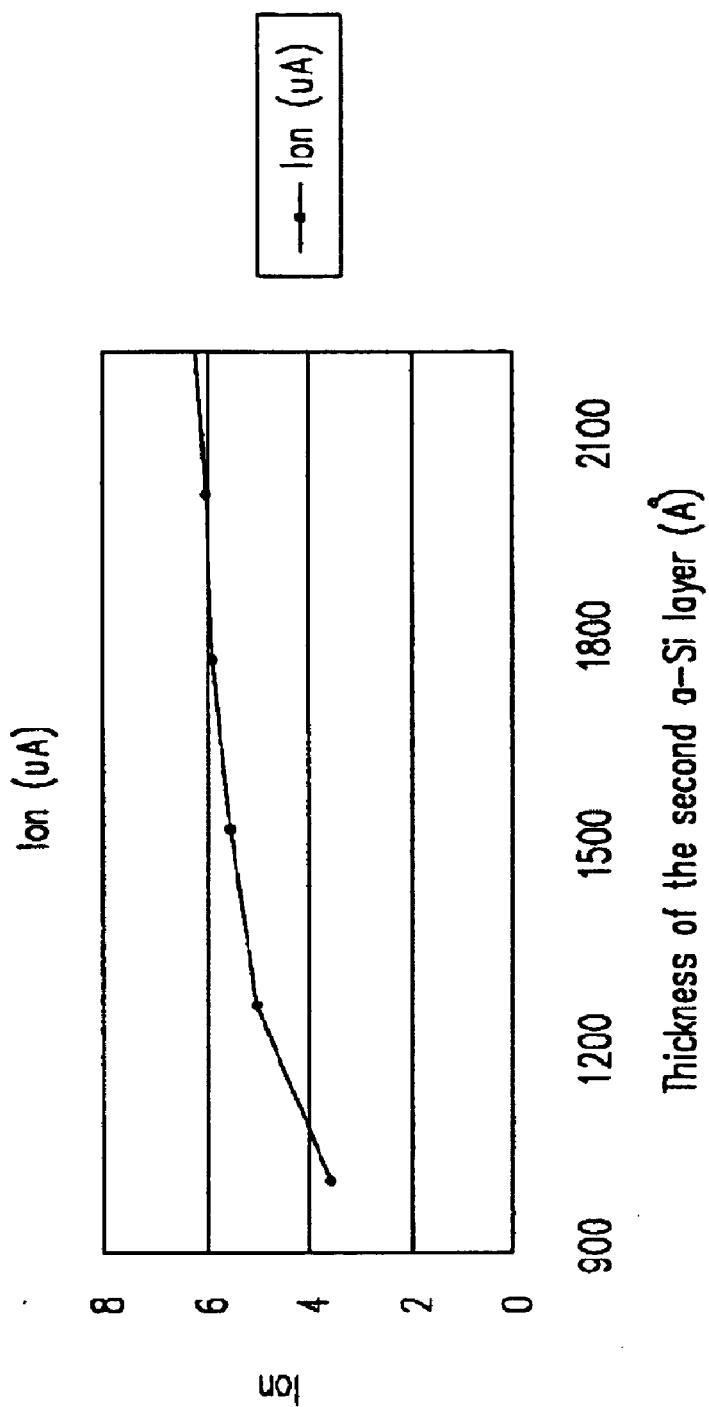
FIGS. 19–22 respectively shows the impact of the thickness of the second a-Si layer to the on current $I_{on}$, the off current $I_{off}$, the threshold voltage $V_{th}$, and the electronic migration rate $\mu_{fe}$.
Figure 20:
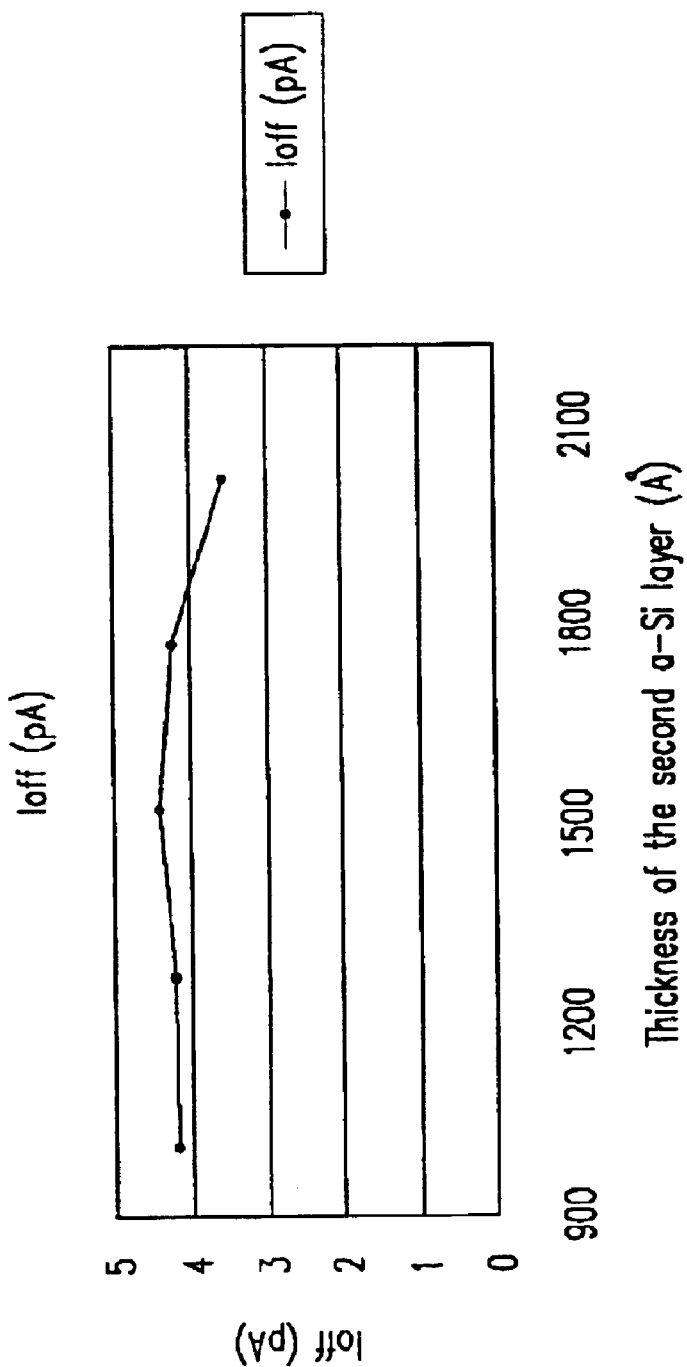
Figure 21:
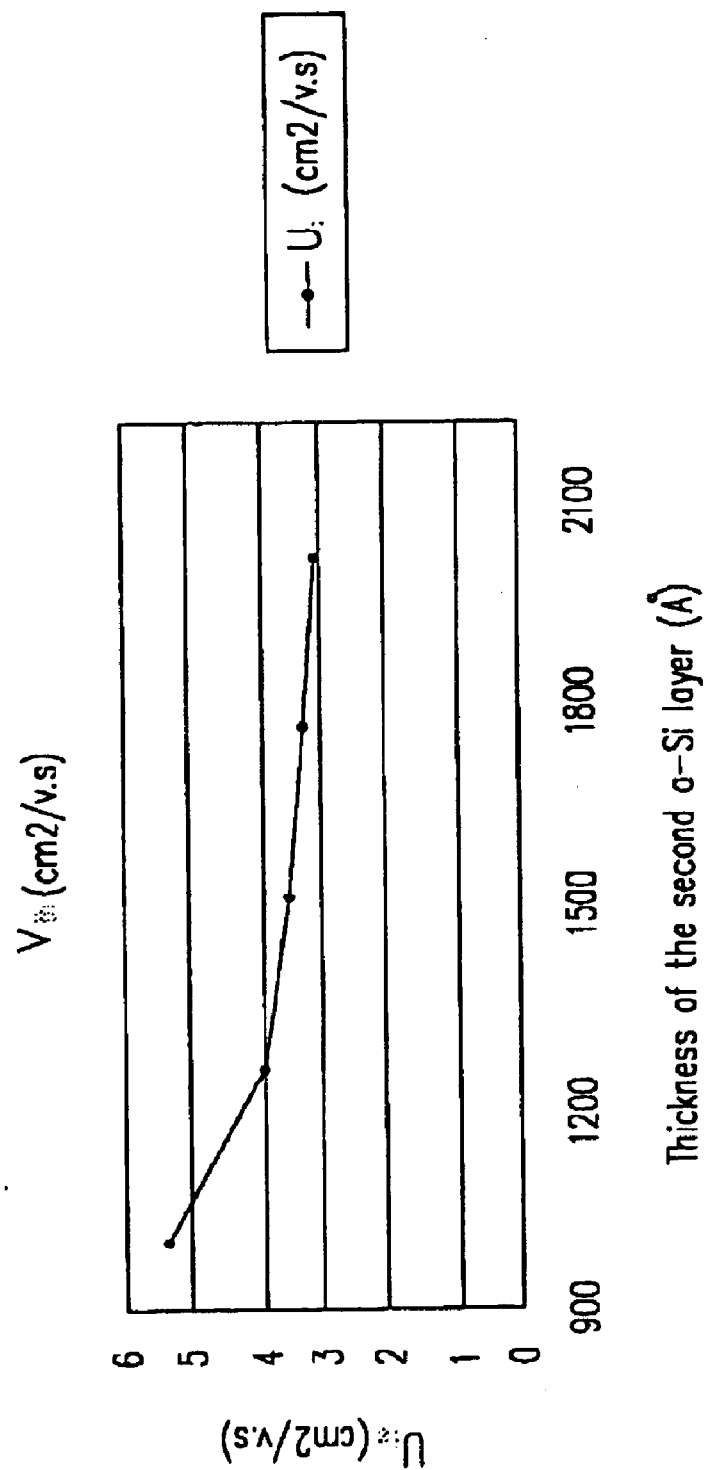
Figure 22:
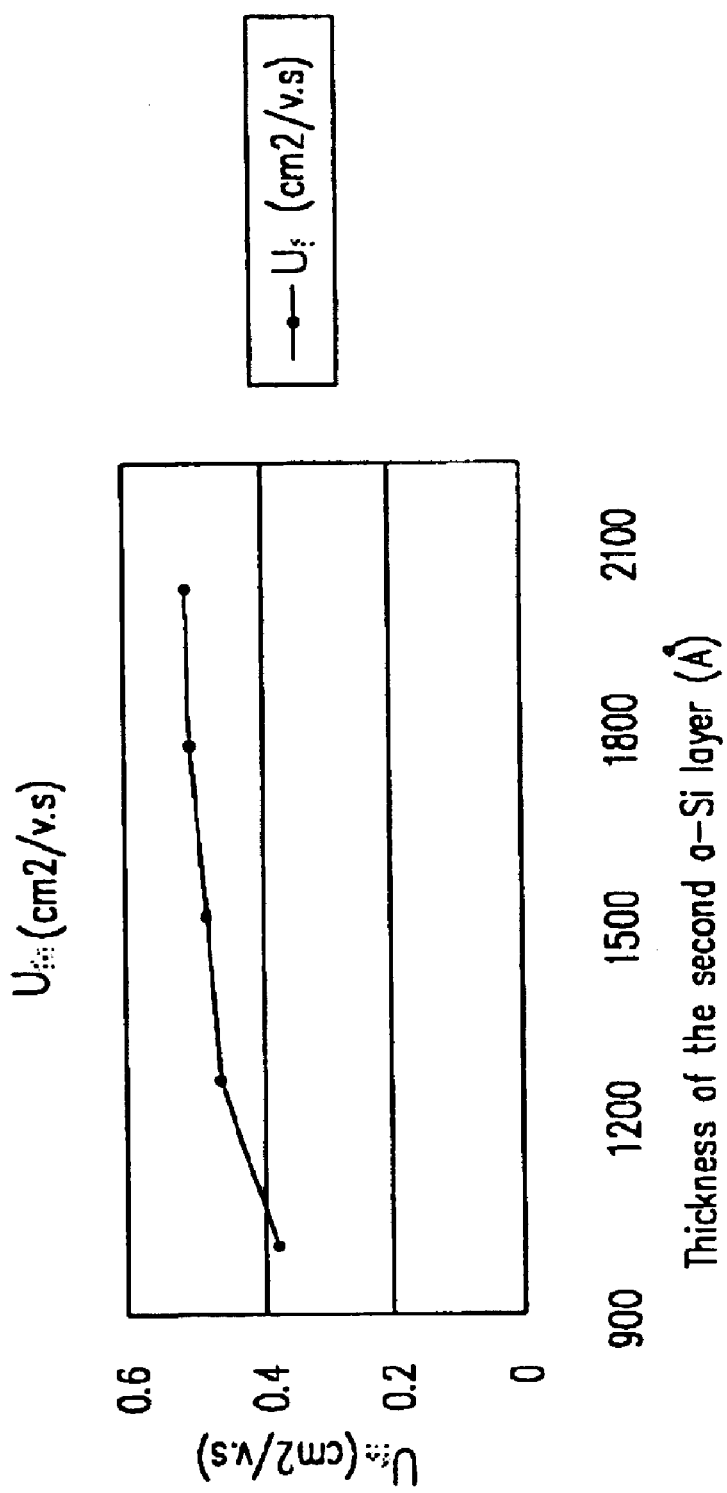

Referring to FIG. 4D, after the first a-Si layer 106a, the second a-Si layer 106b, and the N+Mixed a-Si layer 106c are formed, the patterns of the first a-Si layer 106a, the second a-Si layer 106b, and the N+Mixed a-Si layer 106c are defined by using the microfilm and etch method to form the channel layer 106.

Referring to FIG. 4E, after the channel layer 106 is formed, a source/drain 108 is formed on both sides of the channel layer 106. The source/drain 108 is formed via the method of forming a Metal 2 overall first, then the Metal 2 mentioned above is defined by using the manufacture process of the microfilm and etch to form the source/drain 108. The source/drain 108 is made of conductive materials such as Al/Cr and Ti.

Finally, referring to FIG. 4F, after the source/drain 108 is formed, a passivation layer 110 is further formed on the substrate 100 to cover the three electrodes TFT having the gate 102 and the source/drain 108, so as to further improve the reliability of the elements. Wherein, the passivation layer 110 is made of a material such as SiN or polyimide.

FIG. 5 lists the manufacture process parameters used in the first embodiment (DB025A, DT394A, DT395A, DB340A, and DT293A) and the first a-Si layer formed by using the LDR in the prior art. Referring to FIG. 5, when the first a-Si layer is formed by using the LDR in the prior art, the flux of the $SiH_4$ is 4400 sccm, the flux of $H_2$ is 22000 sccm, the flux ratio of $H_2/SiH_4$ is 5.0, the operating pressure is 1.1 mbar, and the RF power is 140 W. When the first a-Si layer is formed by using the LDR according to the present invention, the flux of the $SiH_4$ is from 1000 to 4400 sccm, the flux of $H_2$ is from 400 to 4600 sccm, the flux ratio of $H_2/SiH_4$ is from 0.40 to 1.00, the operating pressure is from 0.75 to 1.00 mbar, and the RF power is from 70 to 100 W. The major difference between the prior art and the present invention is the flux ratio of $H_2/SiH_4$ is adjusted from 5.0 to a range from 0.40 to 1.00.

In the present invention, when the first a-Si layer 106a is formed, the flux ratio of $H_2/SiH_4$ is intentionally adjusted from the 5.0 used in the prior art to a range from 0.40 to 1.00, so as to reduce the repairing level of the defects in the first a-Si layer by reducing the ratio of the $H_2$ flux. In other words, the first a-Si layer formed in the present invention has more defects.

FIG. 6 lists the manufacture process parameters used in the first embodiment (DB025A, DT394A, DT395A, DB340A, and DT293A) and the second a-Si layer formed by using the HDR in the prior art. Referring to FIG. 6, when the second a-Si layer is formed by using the HDR in the prior art, the flux of the $SiH_4$ is 5700 sccm, the flux of $H_2$ is 5400 sccm, the flux ratio of $H_2/SiH_4$ is 0.95, the operating pressure is 1.4 mbar, and the RF power is 250 W. When the second a-Si layer is formed by using the HDR according to the present invention, the flux of the $SiH_4$ is from 1000 to 5700 sccm, the flux of $H_2$ is from 950 to 5700 sccm, the flux ratio of $H_2/SiH_4$ is from 0.95 to 1.00, the operating pressure is from 1.3 to 1.6 mbar, and the RF power is from 200 to 320 W. It is known from the description mentioned above that there is no big difference between the prior art and the present invention in the manufacture process conditions to form the second a-Si layer.

FIGS. 7–11 respectively lists the electric characteristics and averages of the TFT in the first embodiment (DB025A, DT394A, DT395A, DB340A, and DT293A). Referring to FIG. 7 first, in DB025A, the average of the on current $I_{on}$ is about 7.9112 $\mu A$, the average of the off current $I_{off}$ is about 3.5382 pA, the average of the threshold voltage $V_{th}$ is about 2.4096V, and the average of the electronic migration rate $\mu_{fe}$ is about 0.61 $cm^2/v.s$.

Then, referring to FIG. 8, in DT394A, the average of the on current $I_{on}$ is about 7.8488 $\mu A$, the average of the off current $I_{off}$ is about 2.6698 pA, the average of the threshold voltage $V_{th}$ is about 2.6919V, and the average of the electronic migration rate $\mu_{fe}$ is about 0.6239 $cm^2/v.s$.

Then, referring to FIG. 9, in DT395A, the average of the on current $I_{on}$ is about 8.3186 $\mu A$, the average of the off current $I_{off}$ is about 2.1618 pA, the average of the threshold voltage $V_{th}$ is about 2.6004V, and the average of the electronic migration rate $\mu_{fe}$ is about 0.6571 $cm^2/v.s$.

Then, referring to FIG. 10, in DB340A, the average of the on current $I_{on}$ is about 8.23975 $\mu A$, the average of the off current $I_{off}$ is about 2.885625 pA, the average of the threshold voltage $V_{th}$ is about 1.94425V, and the average of the electronic migration rate $\mu_{fe}$ is about 0.605375 $cm^2/v.s$.

Then, referring to FIG. 11, in DT293A, the average of the on current $I_{on}$ is about 7.8982 $\mu A$, the average of the off current $I_{off}$ is about 2.7052 pA, the average of the threshold voltage $V_{th}$ is about 2.2835V, and the average of the electronic migration rate $\mu_{fe}$ is about 0.6009 $cm^2/v.s$.

FIG. 12 schematically shows a comparison table of the electric characteristics of the TFT in the first embodiment (DB025A, DT394A, DT395A, DB340A, and DT293A). Referring to FIG. 12, in five sets of the experiment of the present embodiment, the average of the on current $I_{on}$ is about 8.043314 $\mu A$, the average of the off current $I_{off}$ is about 2.792125 pA, the average of the threshold voltage $V_{th}$ is about 2.38593V, and the average of the electronic migration rate $\mu_{fe}$ is about 0.61938 $cm^2/v.s$.

When the first a-Si layer is made in the present embodiment, since the flux ratio of $H_2/SiH_4$ is adjusted to stay on a range from 0.40 to 1.00, the formed first a-Si layer has more defects. However, from FIGS. 7–11 and FIG. 12 mentioned above, compared to the prior art, the impact of the behavior of the defects that exist in the first a-Si layer on the TFT electric characteristics considered as a whole, such as the on current $I_{on}$, the off current $I_{off}$, the threshold voltage $V_{th}$, and the electronic migration rate $\mu_{fe}$ is still better than in the prior art.

FIGS. 13–16 respectively shows a comparison table of the on current $I_{on}$, the off current $I_{off}$, the threshold voltage $V_{th}$, and the electronic migration rate $\mu_{fe}$ in the first embodiment (DB025A, DT394A, DT395A, DB340A, and DT293A) and in the conventional TFT. Referring to FIGS. 13–16, in five sets of the experiment of the present embodiment, the behavior of the on current $I_{on}$, the off current $I_{off}$, the threshold voltage $V_{th}$, and the electronic migration rate $\mu_{fe}$ performed are all better than in the prior art. It is clear from FIG. 13 that the TFT of the present embodiment has higher on current $I_{on}$. It is clear from FIG. 14 that the TFT of the present embodiment has lower off current $I_{off}$. It is clear from FIG. 15 that the TFT of the present embodiment has lower threshold voltage $V_{th}$. Moreover, it is also clear from FIG. 16 that the TFT of the present embodiment has higher electronic migration rate $\mu_{fe}$.

FIG. 17 schematically shows a comparison table of the electrical characteristics of the first embodiment (DB025A, DT394A, DT395A, DB340A, and DT293A) and the conventional TFT. Referring to FIG. 17, the on current $I_{on}$ of the TFT in the present embodiment is raised from 6.57 μA used in the prior art to 8.04 μA, the off current $I_{off}$ is lowered from 4.72 pA used in the prior art to 2.79 pA, the threshold voltage $V_{th}$ is lowered from 3.34V used in the prior art to 2.38V, and the electronic migration rate $\mu_{fe}$ is raised from 0.55 cm²/v.s used in the prior art to 0.62 cm²/v.s.

Similarly, referring to FIG. 17, the present invention not only improves the on current $I_{on}$, the off current $I_{off}$, the threshold voltage $V_{th}$, and the electronic migration rate $\mu_{fe}$ of the elements, but also improves the photo leakage current phenomenon when the element is irradiated by the light. The TFT photo leakage current $I_{photo}$ of the present embodiment is lowered to 5E-11 from 1E-10 used in the prior art, the element photo leakage current $I_{photo}$ is lowered nearly an order. The reason the photo leakage current $I_{photo}$ can be reduced is that the first a-Si layer formed in the present embodiment has a larger number of defects compared to the prior art, and these defects trap the photo leakage current in the first a-Si layer, so that the element photo leakage current $I_{photo}$ is reduced.

However, the TFT manufacture process shown in FIGS. 4A–4F is only exemplified for description, and the present invention is not limited to only apply in this manufacture process. The method of the present invention to form the first a-Si layer by reducing the flux ratio of $H_2/SiH_4$ can be applied in other TFT manufacture process.

The Second Embodiment

It is known by those who are skilled in the related art that the film quality and the film thickness of the first a-Si layer, the second a-Si layer and the N+Mixed a-Si layer determine the TFT electrical characteristics such as the on current $I_{on}$, the off current $I_{off}$, the threshold voltage $V_{th}$, and the electronic migration rate $\mu_{fe}$. The first embodiment of the present invention probed into the manufacture process conditions (the portion of the film quality) for making the first a-Si layer as mentioned above. The present embodiment probes into the relationship between the thickness of the second a-Si layer and the electrical characteristics of the element hereinafter.

FIG. 18 is a table schematically showing the relationship of the thickness of the second a-Si layer in the TFT and its electrical characteristics. Referring to FIG. 18, in the present embodiment, the thickness of the first a-Si layer is fixed to stay at about 100 angstroms, the thickness of the N+Mixed a-Si layer is fixed to stay at about 300 angstroms, and the thickness of the second a-Si layer is fixed to stay at about 1000 angstroms, 1250 angstroms, 1500 angstroms, 1750 angstroms, and 2000 angstroms respectively.

When the thickness of the second a-Si layer increases from 1000 angstroms to 2000 angstroms, the on current $I_{on}$ is increased from 3.5415 μA to 6.1005 μA, the off current $I_{off}$ is reduced from 4.19775 pA to 3.61125 pA, the threshold voltage $V_{th}$ is reduced from 5.27225V to 3.15425V, and the electronic migration rate $\mu_{fe}$ is increased from 0.38675 cm²/v.s to 0.5145 cm²/v.s.

FIGS. 19–22 respectively show the impact of the thickness of the second a-Si layer to the on current $I_{on}$, the off current $I_{off}$, the threshold voltage $V_{th}$, and the electronic migration rate $\mu_{fe}$. From FIGS. 19–21, the on current $I_{on}$ is increased along with the increase of the thickness of the second a-Si layer, and the off current $I_{off}$ stays on about 4 pA. However, when the thickness of the second a-Si layer increases to 2000 angstroms, the off current $I_{off}$ is reduced to about 3.6 pA. The threshold voltage $V_{th}$ is reduced along with the increase of the thickness of the second a-Si layer, and the electronic migration rate $\mu_{fe}$ is increased along with the increase of the thickness of the second a-Si layer. Therefore, when the thickness of the second a-Si layer is about 2000 angstroms, the TFT has the best electrical characteristics.

The present invention discloses controlling the flux ratio of $H_2/SiH_4$ to be within a range of from 0.40 to 1.00 to form the first a-Si layer having defects in the first embodiment, so as to reduce the photo leakage current $I_{photo}$ of the element. Moreover, the present invention discloses modifying the film thickness of the second a-Si layer in the second embodiment, so that the best electrical characteristics can be obtained. Although the first and the second embodiment are disclosed respectively above, it does not mean they cannot work well together. In order to further improve the element characteristics, the present invention may combine the contents disclosed in the second embodiment together to make the first a-Si layer and the second a-Si layer in the channel layer.

In summary, the TFT manufacture method of the present invention has at least the following advantages:

1. When the first a-Si layer is formed by using the LDR, the flux ratio of $H_2/SiH_4$ is controlled within a range from 0.40 to 1.00. Although the film quality of the formed first a-Si layer is worse than in the prior art (since it has more defects), the TFT electrical characteristics considered as a whole, such as the on current $I_{on}$, the off current $I_{off}$, the threshold voltage $V_{th}$, and the electronic migration rate $\mu_{fe}$, perform better than in the prior art.

2. The present invention modifies the film quality of the first a-Si layer. Since there are more defects in the first a-Si layer, the photo leakage current generated when the element is irradiated can be efficiently reduced.

3. The present invention obtains the optimum electrical characteristics of the element by modifying the film thickness of the second a-Si layer to a range from 1000 angstroms to 2000 angstroms.

Although the invention has been described with reference to a particular embodiment thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A Thin Film Transistor (TFT) manufacture method, comprising:

providing a substrate;

forming a gate on the substrate;

forming a gate isolation layer on the substrate and covering the gate;

forming a first a-Si layer on the gate isolation layer that is arranged above the gate by using a Chemical Vapor Deposition (CVD) method, wherein the first a-Si layer is formed under a condition of a flux ratio of $H_2/SiH_4$ within a range from 0.40 to 1.00;

forming a second a-Si layer on the first a-Si layer by using the CVD method;

performing a N-type deposition on a surface of the second a-Si layer to form a N+Mixed a-Si layer;

defining the first a-Si layer, the second a-Si layer, and the N+Mixed a-Si layer to form a channel layer; and forming a source/drain on both sides of the channel layer.

2. The TFT manufacture method of claim 1, wherein after the source/drain is formed, a passivation layer is further formed on the substrate to cover the source/drain, the channel layer, and the gate isolation layer.

3. The TFT manufacture method of claim 1, wherein the second a-Si layer is formed under a condition of the flux ratio of $H_2/SiH_4$ being within a range from 0.95 to 1.00.

4. The TFT manufacture method of claim 1, wherein a plurality of manufacture process conditions to form the first a-Si layer comprise:

a flux of $SiH_4$ is from 1000 to 4600 sccm;

a flux of $H_2$ is from 400 to 4600 sccm;

an operating pressure is from 0.75 to 1.00 mbar; and a radio frequency (RF) power is from 70 to 100 W.

5. The TFT manufacture method of claim 1, wherein the manufacture process conditions to form the second a-Si layer comprise:

the flux of $SiH_4$ is from 1000 to 5700 sccm;

the flux of $H_2$ is from 950 to 5700 sccm;

the operating pressure is from 1.3 to 1.6 mbar; and the radio frequency (RF) power is from 200 to 320 W.

6. The TFT manufacture method of claim 1, wherein a thickness of the first a-Si layer is from 100 to 500 angstroms.

7. The TFT manufacture method of claim 1, wherein a thickness of the second a-Si layer is from 1000 to 2000 angstroms.

8. The TFT manufacture method of claim 1, wherein a thickness of the N+Mixed a-Si layer is from 200 to 400 angstroms.

9. The TFT manufacture method of claim 1, wherein a deposition rate of the first a-Si layer is smaller than the deposition rate of the second a-Si layer.

* * * * *